(12) United States Patent
Yang et al.

(10) Patent No.: US 9,075,088 B2
(45) Date of Patent: Jul. 7, 2015

(54) POWER QUALITY MONITORING APPARATUS AND METHOD THEREOF

(75) Inventors: Wan Cheol Yang, Gyeonggi-do (KR); Jung Hoo Lee, Gyeonggi-do (KR); Kyung Uk Kim, Gyeonggi-do (KR)

(73) Assignee: SAMSUNG ELECTRO-MECHANICS CO., LTD., Gyunggi-Do (KR)

( * ) Notice: Subject to any disclaimer, the term of this patent is extended or adjusted under 35 U.S.C. 154(b) by 553 days.

(21) Appl. No.: 13/461,511

(22) Filed: May 1, 2012

(65) Prior Publication Data
US 2013/0158909 A1 Jun. 20, 2013

(30) Foreign Application Priority Data

Dec. 20, 2011 (KR) ........................ 10-2011-0138396

(51) Int. Cl.
| | |
|---|---|
| *G06F 19/00* | (2011.01) |
| *G01R 19/00* | (2006.01) |
| *G01R 19/30* | (2006.01) |
| *G01R 19/04* | (2006.01) |

(52) U.S. Cl.
CPC ............ *G01R 19/0084* (2013.01); *G01R 19/30* (2013.01); *G01R 19/04* (2013.01)

(58) Field of Classification Search
CPC .... G01R 19/30; G01R 19/0084; G01R 19/04; G01R 19/165; G01R 31/00
USPC .............................. 702/57, 60, 61, 62, 64, 81
See application file for complete search history.

(56) References Cited

U.S. PATENT DOCUMENTS 8,190,381 B2 * 5/2012 Spanier et al. .................. 702/60

FOREIGN PATENT DOCUMENTS

| | | |
|---|---|---|
| JP | 11-237413 | 8/1999 |
| JP | 2001084042 | 3/2001 |
| JP | 2003-153433 A | 5/2003 |
| JP | 2004096871 | 3/2004 |
| KR | 100915401 | 9/2009 |
| KR | 10-2011-0035087 A | 4/2011 |

* cited by examiner

*Primary Examiner* — John H Le
(74) *Attorney, Agent, or Firm* — Bracewell & Giuliani LLP; Brad Y. Chin

(57) ABSTRACT

The present invention includes a calculating unit for calculating an absolute value of an applied commercial voltage, an accumulating unit for accumulating the absolute value of the applied commercial voltage per a constant period to output, an extracting unit for sampling an absolute value accumulative maximum value of the commercial voltage for each period and a determining unit for determining a quality of the commercial voltage by using the absolute value accumulative maximum value of the sampled commercial voltage. It has an advantage that the power quality can be monitored at high speed.

16 Claims, 4 Drawing Sheets

POWER QUALITY MONITORING APPARATUS AND METHOD THEREOF

CROSS-REFERENCE TO RELATED APPLICATIONS

This application claims the benefit of Korean Patent Application No. 10-2011-0138396 filed with the Korea Intellectual Property Office on Dec. 20, 2011, the disclosure of which is incorporated herein by reference.

BACKGROUND OF THE INVENTION

1. Field of the Invention

The present invention relates to a power quality monitoring apparatus and a method thereof; and, more particularly to a power quality monitoring apparatus and a method thereof capable of detecting the quality of power such as a sudden voltage swell and sag.

2. Description of the Related Art

In conventional, electronic products such as a computer, a communication device, a medical device and a military device are load very sensitive to a power quality. Since such industrial, commercial and military loads are operated by being connected on an automatic process mutually, a power system connected thereto such loads has affected to the power quality very sensitively.

The power quality is classified into a voltage quality and a current quality; the voltage quality deals with states such as a voltage swell, a voltage sag, an under voltage, an over voltage, an interruption, a noise and other factor such as a DC offset, harmonics, inter-harmonics, notching, a voltage imbalance, a voltage fluctuation and a flicker and the like; and the current quality deals with a power interruption problem such as the distortion of the voltage according to the current distortion is generated as the nonlinear load is increased.

On the other hands, as the power quality monitoring apparatus is a means to monitor whether an erroneous operation is generated in a power system and load devices by being installed between power systems (power systems in the generation and transmission/distribution steps), that is, a power side and the load device, if the erroneous operation is generated in the power system and the load devices, it can prevent an accident in advance by protecting the power system and the load devices by blocking the circuits between the power system and the load devices or analyzing the power quality.

In order to this, the power quality monitoring apparatus according to the prior art converts the voltage and current signals of analog shapes into the digital data by sampling the analog signals, calculates an RMS (Root Mean Square) by using the converted digital data and employs a method to sense the generation of accidents through comparing the calculated RMS with the reference value.

However, although data above a minimum number of periods are required to detect the RMS in the power quality monitoring apparatus according to the prior art, but there is a problem difficult to detect since the change is nearly not in the RMS in case when the numerical value is changed during a short continuing time such as voltage swell and sag. That is, since the power quality monitoring apparatus according to the prior art takes a long time for calculating the RMS, it has a problem not to monitor the voltage swell and sag generated during a short continuing time such as a half period.

SUMMARY OF THE INVENTION

The present invention has been invented in order to overcome the above-described problems and it is, therefore, an object of the present invention to provide a power quality monitoring apparatus and a method thereof capable of monitoring the quality of power such as a sudden voltage swell and sag at high speed.

In accordance with one aspect of the present invention to achieve the object, there is provided a power quality monitoring apparatus, including a calculating unit for calculating an absolute value of an applied commercial voltage, an accumulating unit for accumulating the absolute value of the applied commercial voltage per a constant period to output, an extracting unit for sampling an absolute value accumulative maximum value of the commercial voltage for each period and a determining unit for determining a quality of the commercial voltage by using the absolute value accumulative maximum value of the sampled commercial voltage.

The power quality monitoring apparatus further includes a control unit to control so as to sample the absolute value accumulative maximum value of the commercial voltage in the extracting unit whenever the commercial voltage reaches a predetermined time by monitoring the applied commercial voltage.

The control unit controls so as to initialize the absolute value of the commercial voltage accumulated in the accumulating unit after controlling so as to sample the absolute value accumulative maximum value of the commercial voltage.

The predetermined time is a time when the commercial voltage is zero crossed.

The time when the commercial voltage is zero crossed reaches per a half period of the commercial voltage.

The control unit includes a detector for detecting whether the commercial voltage reaches the predetermined time or not by monitoring the applied commercial voltage and a timing controller for outputting an extraction control signal to the extracting unit so as to sample the absolute value accumulative maximum value of the commercial voltage in the extracting unit when the commercial voltage reaches the predetermined time.

The timing controller further outputs a reset control signal to the accumulating unit so as to initialize the absolute value of the commercial voltage accumulated in the accumulating unit after an extraction control signal is outputted to the extracting unit.

The extracting unit is a sample and hold circuit.

The commercial voltage is an alternative voltage.

The power quality monitoring apparatus further includes a noise removing unit for removing a noise of the applied commercial voltage.

The power quality monitoring apparatus further includes a gain control unit for controlling a gain of an absolute value of the outputted commercial voltage.

The determining unit compares a predetermined reference voltage with an absolute value accumulative maximum value of the sampled commercial voltage and determines a quality of the commercial voltage by using the compared result.

The determining unit compares a first predetermined reference voltage and a predetermined second reference voltage with the absolute value accumulative maximum value of the sampled commercial voltage and determines whether a voltage swell or a voltage sag is generated at the commercial voltage by using the compared result.

The determining unit includes a first determining device to determine that the voltage swell is generate if the absolute value accumulative maximum value of the sampled commercial voltage is larger than the first reference voltage.

The determining unit includes a second determining device to determine that the voltage sag is generate if the absolute value accumulative maximum value of the sampled commercial voltage is smaller than the second reference voltage.

In accordance with another aspect of the present invention to achieve the object, there is provided a method for monitoring a power quality, including: calculating an absolute value of an applied commercial voltage; accumulating the absolute value of the commercial voltage per a constant period to output; sampling an absolute value accumulative maximum value of the commercial voltage per each period; and determining a quality of the commercial voltage by using the absolute value accumulative maximum value of the sampled commercial voltage.

Before sampling an absolute value accumulative maximum value of the commercial voltage per each period, the method further includes: monitoring the applied commercial voltage; and outputting an extracting control signal so as to sample the absolute value accumulative maximum value of the commercial voltage whenever the commercial voltage reaches the predetermined time, wherein sampling an absolute value accumulative maximum value of the commercial voltage per each period samples the absolute value accumulative maximum value of the commercial voltage whenever the extracting control signal is outputted.

After outputting an extracting control signal, the method further including: outputting a reset control signal so as to initialize the absolute value of the accumulative commercial voltage, wherein accumulating the absolute value of the commercial voltage per a constant period to output initializes the absolute value of the accumulated commercial voltage whenever the reset control signal is outputted.

The predetermined time is a time when the commercial voltage is zero crossed.

The time when the commercial voltage is zero crossed reaches per half period of the commercial voltage.

The determining a quality of the commercial voltage compares a first predetermined reference voltage and a second predetermined reference voltage with the absolute value accumulative maximum value of the sampled commercial voltage and determines whether a voltage swell or a voltage sag is generated at the commercial voltage by using the compared result.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

The terms or words used in the present specification and claims should not be interpreted as being limited to typical or dictionary meanings, but should be interpreted as having meanings and concepts relevant to the technical spirit of the present invention based on the rule according to which an inventor can appropriately define the concept of the term to describe his/her own invention in the best manner.

Therefore, configurations shown in embodiments and the drawings of the present invention rather are examples of the most exemplary embodiment and do not represent all of the technical spirit of the invention. Thus, it will be understood that various equivalents and modifications that replace the configurations are possible when filing the present application.

Hereinafter, embodiments of the present invention will be described in detail with reference to the accompanying drawings.

Figure 1:
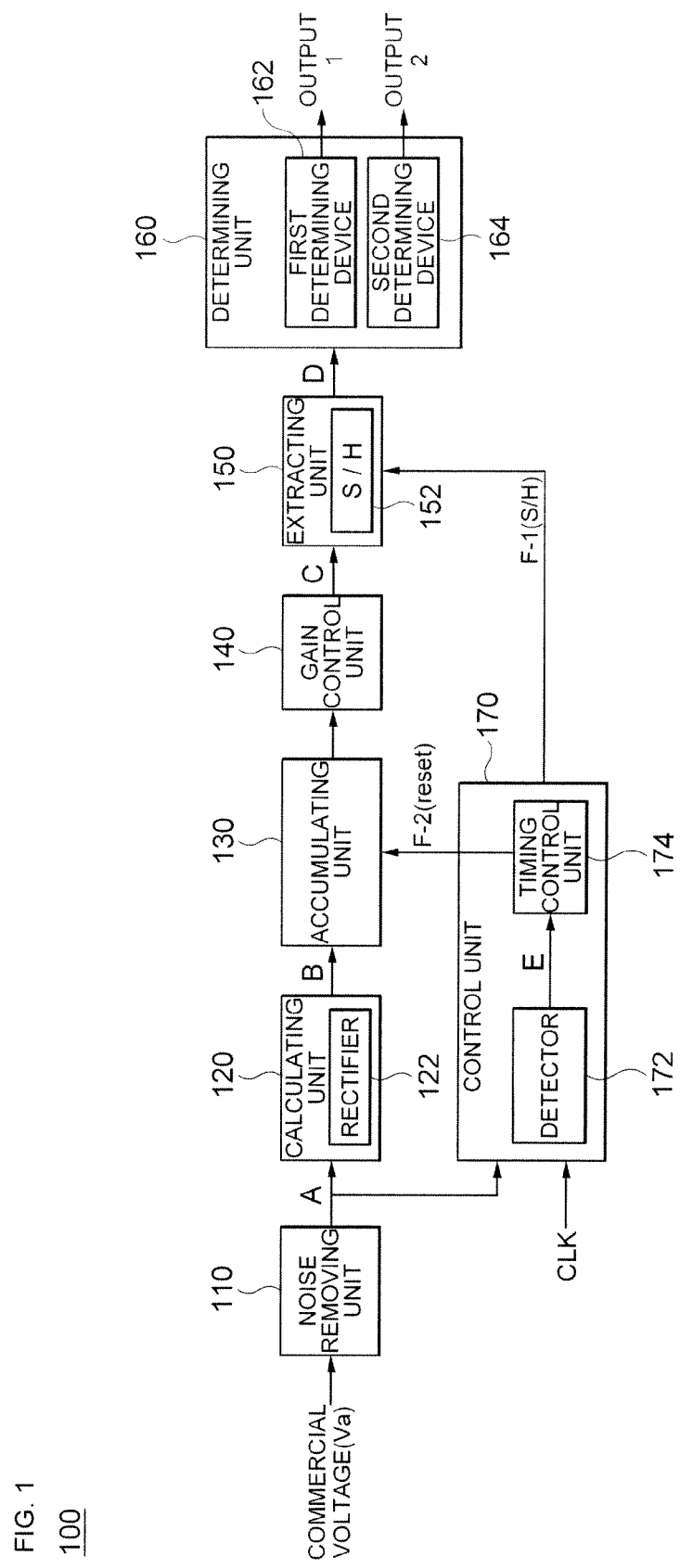
FIG. 1 is a construction diagram of a power quality monitoring apparatus in accordance with one embodiment of the present invention.

FIG. 1 is a construction diagram of a power quality monitoring apparatus in accordance with one embodiment of the present invention.

As shown in FIG. 1, the power quality monitoring apparatus 100 includes a noise removing unit 110, a calculating unit 120, an accumulating unit 130, a gain control unit 140, a determining unit 160 and a control unit 170.

Briefly explaining the above-described power quality monitoring apparatus, the power quality monitoring apparatus is a means to detect states such as a voltage swell and sag, an under and over voltage, an interruption, a noise, other factors such as a DC offset, harmonics, inter-harmonics and notching, a voltage imbalance, a voltage fluctuation and a flicker as an apparatus to monitor whether an erroneous operation is generated in a power system and a load device by being installed between a power side and the load device, i.e., the power system in the generation and transmission/distribution steps.

Particularly, the power quality monitoring apparatus in accordance with one embodiment of the present invention is explained concentrically on a method to detect voltage swell and sag at high speed which are not detected in a prior art due to the change of numerical value during a short time as a half period.

The noise removing unit 110 can remove the noise of DC (Direct Current) component included in a commercial voltage in a shape of an AC (Alternating Current) as a means to remove the noise of the applied commercial voltage Va. Such noise removing unit 110 may be formed of a filter including a capacitor or the like.

Figure 2:
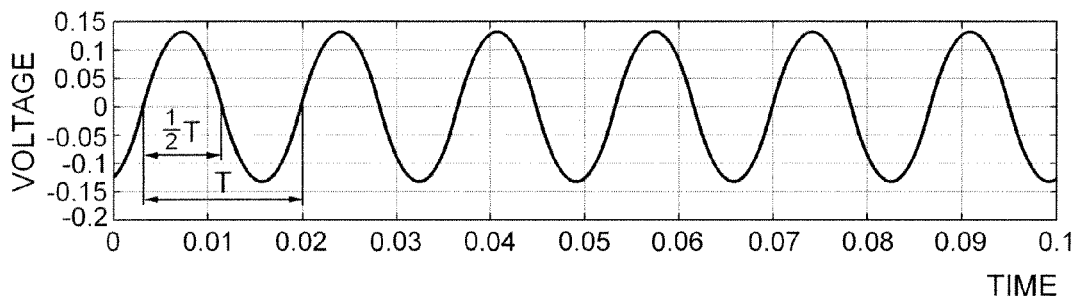
FIG. 2 is a voltage waveform diagram A outputted in a noise removing unit as shown in FIG. 1.

As FIG. 2 is a voltage waveform diagram A outputted in a noise removing unit as shown in FIG. 1, the commercial voltage in the AC shape obtained by removing the DC component may be outputted, as shown in FIG. 2, in the noise removing unit 110.

The calculating unit 120 may be formed of a rectifier 122 to rectify the AC voltage as a means to calculate an absolute value of the commercial voltage.

Figure 3:
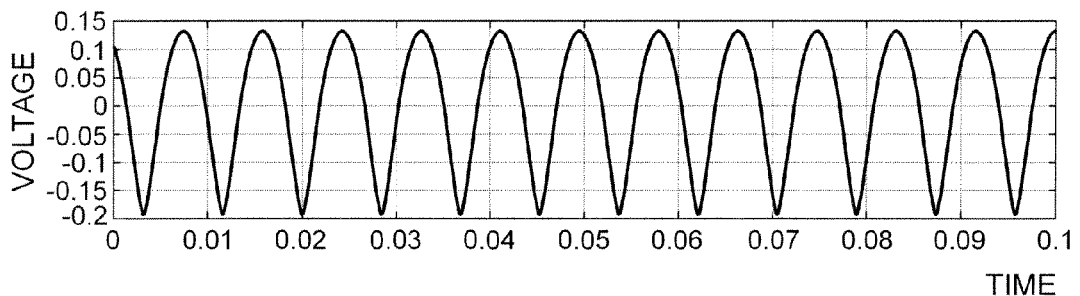
FIG. 3 is a voltage waveform diagram B outputted in a calculating unit as shown in FIG. 1.

As FIG. 3 is a voltage waveform diagram B outputted in a calculating unit as shown in FIG. 1, the rectifier 122 allows the commercial voltage in a shape of sine wave to have a voltage waveform of all positives + by rectifying the commercial voltage, as shown in FIG. 3. Accordingly, the commercial voltage rectified in the rectifier 122 may have a frequency being approximately double in comparison with the commercial voltage of FIG. 2 outputted in the power system.

The accumulating unit 130 outputs the absolute value of the commercial voltage per a constant period. That is, the accumulating unit 130 can sum the absolute value of the commercial voltage continuously per the constant period and can detect the amplitudes in each period by integrating the absolute value of the commercial voltage corresponding to each period.

The accumulating unit 130 is formed of a structure including the integrator as shown in FIG. 3 and can measure the amplitudes of the commercial voltage by integrating the absolute values of the commercial voltage per a half period.

The gain control unit 140 can control the size of the absolute value of the commercial voltage by adding the gain to the absolute value of the commercial voltage accumulated in the accumulating unit 130. More specifically, the gain control unit 140 can output the absolute value of the commercial voltage added thereto the appropriate gain according to the type or characteristics of the power side and the load devices.

Figure 4:
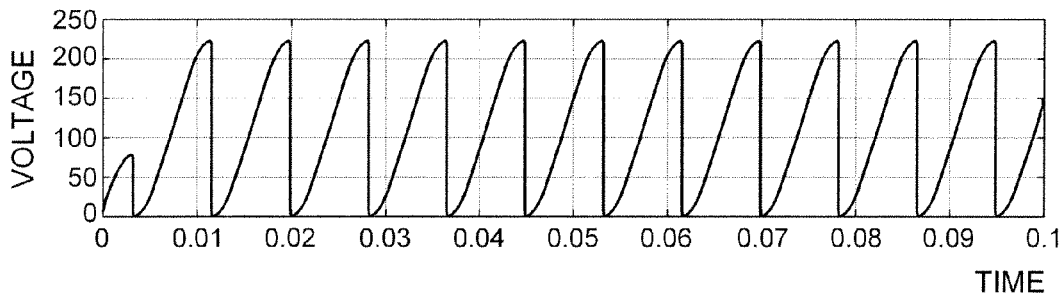
FIG. 4 is a voltage waveform diagram C outputted in a gain controlling unit as shown in FIG. 1.

As FIG. 4 is a voltage waveform diagram C outputted in a gain controlling unit as shown in FIG. 1, referring to FIG. 4, the accumulating unit 130 accumulates the absolute value of the commercial voltage per the half period ½ T of the commercial voltage to output and can increase and output the gain of the absolute value of the commercial voltage.

As the extracting unit 150 is a means to sample the absolute value accumulative maximum value of the commercial voltage, it performs an operation to output by standardizing the amplitude of the commercial voltage as the maximum value of the absolute value of the commercial voltage accumulated in the accumulating unit 130 per each period.

Herein, the extracting unit 150 may be formed of a sample and hold circuit S/H 152 and the sample and hold circuit 152 can continue an operation to convert the waveform of the continuous input voltage into the discontinuous waveform, that is, the voltage sustained by sampling (standardization) and holding the sampled results by a predetermined time as it is.

Figure 5:
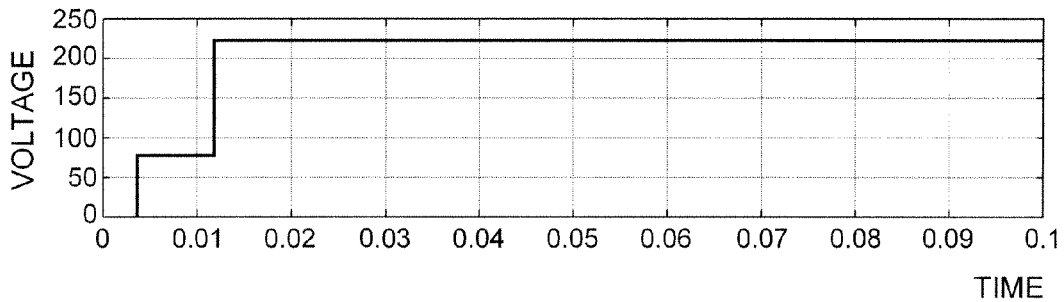
FIG. 5 is a voltage waveform diagram D outputted in an extracting unit as shown in FIG. 1.

As FIG. 5 is a voltage waveform diagram D outputted in an extracting unit as shown in FIG. 1, as shown in FIG. 5, the sample and hold circuit 152 samples the absolute value accumulative maximum value of the commercial voltage per the half period ½ T of the commercial voltage and may sustain the absolute value accumulative maximum value of the sampled commercial voltage during the constant time.

As the determining unit 160 is a means to determine the quality of the commercial voltage by using the absolute value accumulative maximum value of the sampled commercial voltage, it may compare the predetermined reference voltage with the absolute value accumulative maximum value of the sample commercial voltage and may determine the quality of the commercial voltage by using the compared results.

Explaining in detail, the determining unit 160 compares the first predetermined voltage Vref1 and the second predetermined voltage Vref2 with the absolute value accumulative maximum value of the sampled commercial voltage including a first and a determining devices 162 and 164 and determines whether the voltage swell or the voltage sag is generated in the commercial voltage by using the compared results, and it determines that the voltage swell is generated if the absolute value accumulative maximum value of the sampled commercial voltage is larger than the first reference voltage Vref1 in the first determining device 162.

And, the second determining device 164 determines that the voltage sag is generated if the absolute value accumulative maximum value of the sampled commercial voltage is smaller than the second reference voltage Vref2.

The control unit 170 controls so as to sample the absolute value accumulative maximum value of the commercial voltage in the extracting unit 150 whenever the commercial voltage reaches the predetermined time by monitoring the applied commercial voltage.

And, the control unit 170 controls so as to initialize the absolute value of the commercial voltage accumulated in the accumulating unit 130, after the absolute value accumulative maximum value of the commercial voltage.

Figure 6:
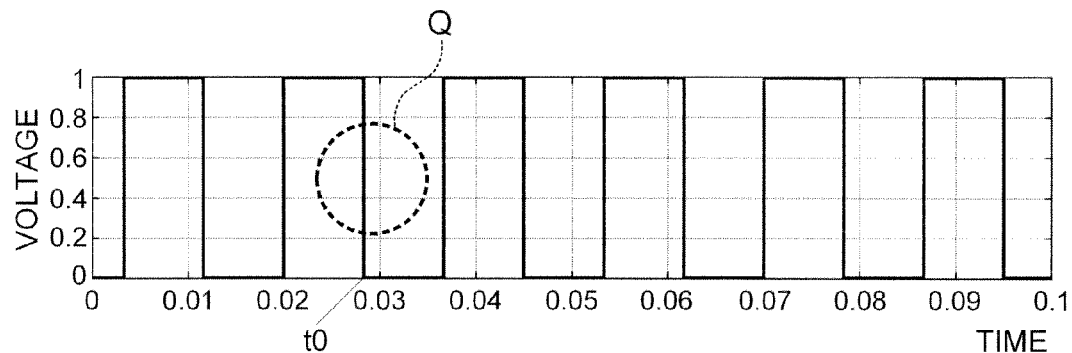
FIG. 6 is a voltage waveform diagram E outputted in a detector as shown in FIG. 1.
Figure 7:
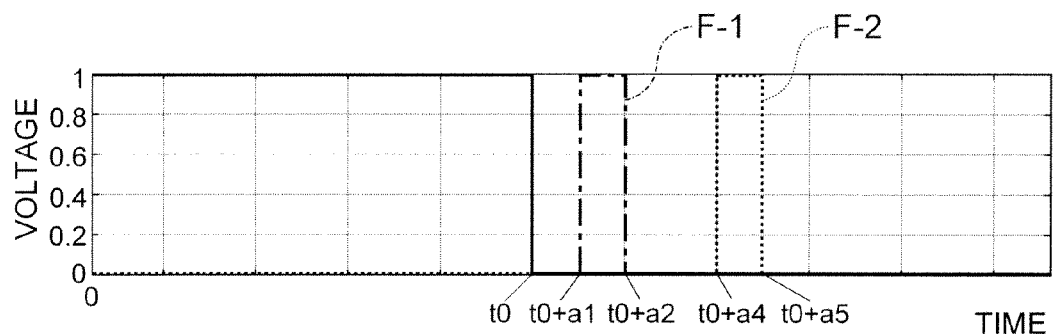
FIG. 7 is a signal waveform diagram outputted in a timing controller, shown in FIG. 1, as a view enlarging a period Q of FIG. 6.

FIG. 6 is a voltage waveform diagram E outputted in a detector as shown in FIG. 1 and FIG. 7 is a signal waveform diagram outputted in a timing controller, shown in FIG. 1, as a view enlarging a period Q of FIG. 6.

Explaining more specifically with reference to FIG. 6 and FIG. 7, the control unit 170 includes a detector 172 and a timing control device 174, and detects whether the commercial voltage reaches the predetermined time by monitoring the applied commercial voltage in the detector 172. That is, the detector 172, as shown in FIG. 6, detects whether the commercial voltage reaches the time to perform the zero crossing and may transmit the detected result to the timing control device 174 in a shape of a signal.

The timing control device may output the control signal to the extracting unit 150 and the accumulating unit 130 corresponding to the signal outputted in the detector 172 and may be formed of a counter.

As shown in FIG. 6 and FIG. 7, after detecting as the commercial voltage reaches the predetermined time in the period Q as the time is t0, after the time a1 is passed, the timing control unit 174 outputs an extracting control signal F-1 to the extracting unit 150 so as to sample the absolute value accumulative maximum value of the commercial voltage in the extracting unit 150.

And, if the time a4 is passed, in the timing control unit 174, a reset control signal F-2 is further outputted to the accumulating unit 130 so as to initialize the absolute value of the commercial voltage accumulated in the accumulating unit 130 according to the applied clock signal CLK.

Such processes may be repeated in the constant period, i.e., the half period.

On the other hands, as shown in FIG. 2, since the time that the commercial voltage is zero crossed reaches per the half period of the commercial voltage, the power quality monitoring apparatus 100 may calculate the amplitude of the commercial voltage per half period; and, in this result, after the amplitude of the commercial voltage is calculated, it may detect whether the voltage swell or the voltage sag is generated in the commercial voltage after passing the half period.

Figure 8:
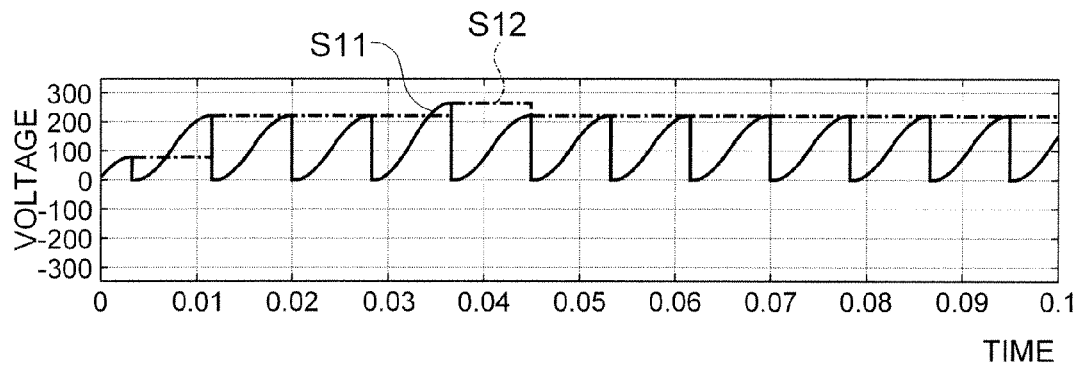
FIG. 8 is a waveform diagram showing operations to generate a sudden voltage swell and to detect the generated result.
Figure 9:
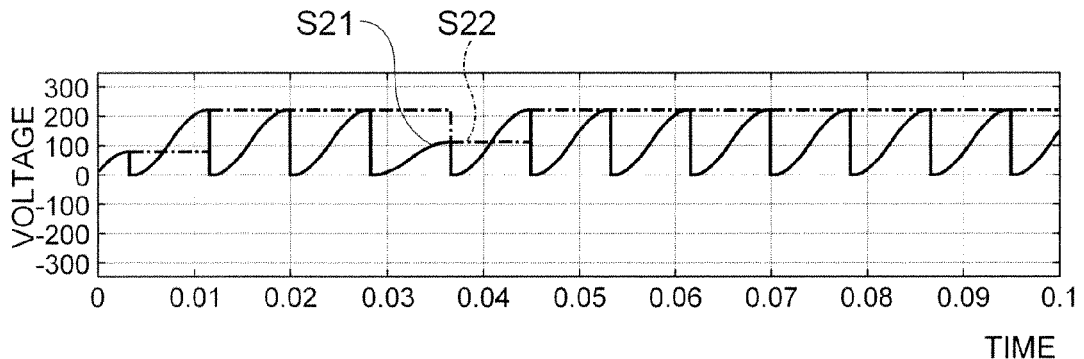
FIG. 9 is a waveform diagram showing operations to generate a voltage sag and to detect the generated result.

FIG. 8 is a waveform diagram showing operations to generate a sudden voltage swell and to detect the generated result and FIG. 9 is a waveform diagram showing operations to generate voltage sag and to detect the generated result.

Referring to FIG. 8, after the voltage swell is generated in the period S11, the voltage swell may be detected in the period S12. i.e., a period after passing a half period, and, as shown in FIG. 9, after the voltage sag is generated in the period S21, the voltage sag may be detected in the period S22, i.e., a period after passing a half period.

Like this, the power quality monitoring apparatus in accordance with one embodiment of the present invention may detect the power quality such as the voltage swell and sag at high speed through a method to calculating the amplitude of the commercial voltage.

Hereinafter, the method for monitoring the power quality in accordance with another embodiment of the present invention will be described.

Figure 10:
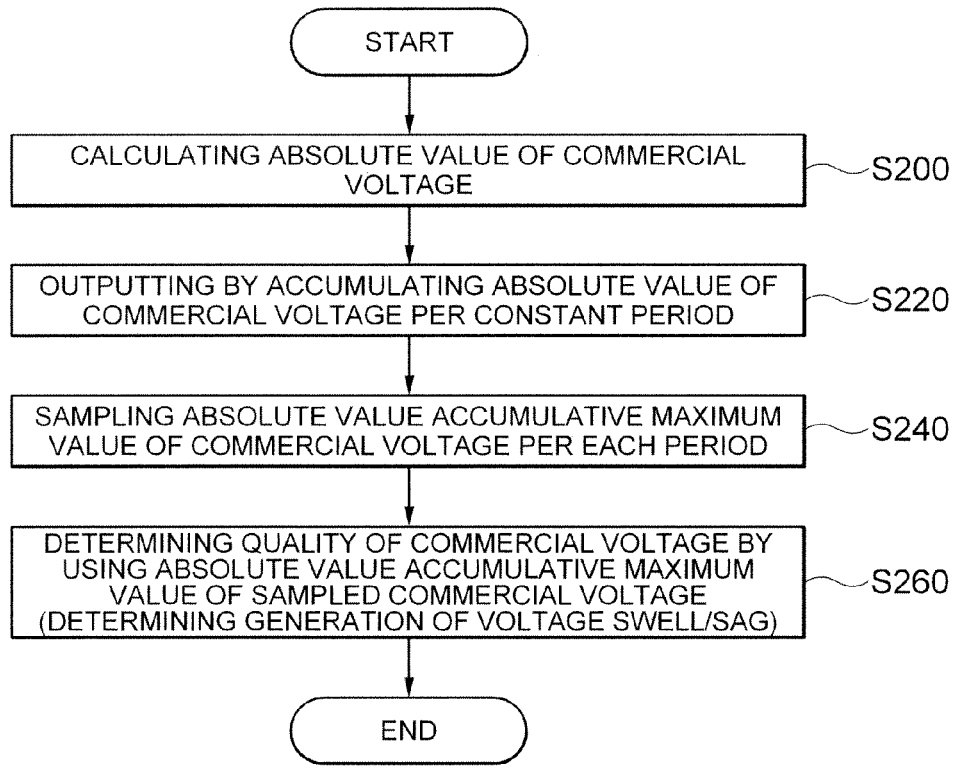
FIG. 10 is an operation flowchart showing a process for monitoring the power quality in accordance with another embodiment of the present invention.

FIG. 10 is an operation flowchart showing a process for monitoring the power quality in accordance with another embodiment of the present invention.

Referring to FIG. 10, the absolute value of the applied commercial voltage is calculated (S200). That is, it can be calculated to allow the commercial voltage in a shape of sine wave to have the voltage waveform of all positive + by rectifying the commercial voltage.

And, the absolute value of the commercial voltage is accumulated per a constant period to output (S220). That is, the absolute value of the commercial voltage is continuously summed in order to accumulate the absolute value of the commercial voltage, and the amplitude of the commercial voltage may be detected in each period by integrating the absolute value of the commercial voltage per the constant period.

Thereafter, the absolute value accumulative maximum value of the commercial voltage is sampled whenever the extraction control signal is outputted (S240).

In order to this, the applied commercial voltage is monitored and the extraction control signal may be outputted so as to sample the absolute value accumulative maximum value of the commercial voltage whenever the commercial voltage reaches the predetermined time.

And also, as shown in FIG. 4 and FIG. 5, it can be controlled by sustaining the absolute value accumulative maximum value of the commercial voltage per the half period by sampling the absolute value accumulative maximum value of the commercial voltage per the half period of the commercial voltage to output the extraction control signal.

Thereafter, the reset control signal is outputted so as to initialize the absolute value of the accumulated commercial voltage and the process to initialize the absolute value of the accumulative commercial voltage is repeated whenever the reset control signal is outputted.

Thereafter, the quality of the commercial voltage is determined by using the absolute value accumulative maximum value of the sampled commercial voltage (S260).

That is, the predetermined reference voltage is compared with the absolute value accumulative maximum value of the sampled commercial voltage and the quality of the commercial voltage may be determined by using the compared result. The first and second predetermined reference voltages are compared with the absolute value accumulative maximum value of the sampled commercial voltage and it is determined whether the voltage swell or the voltage sag is generated in the commercial voltage by using the compared result.

For example, if the absolute value accumulative maximum value of the sampled commercial voltage is larger than the first reference voltage, it is determined that the voltage swell is generated. If the absolute value accumulative maximum value of the sampled commercial voltage is smaller than the second reference voltage, it is determined that the voltage sag is generated.

Like this, since the time to detect the voltage swell and sag can be reduced below the half period of the commercial voltage, it has advantages that the quality of power can be rapidly monitored and the complexity of calculation can be minimized through the method to calculate the amplitude of the commercial voltage.

As described the above, according to the power quality monitoring apparatus in accordance with one embodiment of the present invention and the method thereof, they have advantages that the power quality such as the voltage swell and sag of the commercial voltage can be detected at high speed in comparison with a method to calculate an RMS (Root Mean Square) such as a prior art.

Particularly, they have the advantages that the voltage swell and sag can be rapidly detected by monitoring the quality of power through comparing the result based on the amplitude of the commercial voltage with the reference voltage and the complexity of calculation can be minimized.

That is, there is an advantage that the time to detect the voltage swell and sag can be reduced below the half period of the commercial voltage.

In this result, there is an advantage that the reliability of the power quality monitoring apparatus can be improved.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A power quality monitoring apparatus, comprising:
  a calculating unit for calculating an absolute value of an applied commercial voltage;
  an accumulating unit for accumulating the absolute value of the applied commercial voltage per a constant period to output;
  an extracting unit for sampling an absolute value accumulative maximum value of the commercial voltage for each period; and
  a determining unit for determining a quality of the commercial voltage by using the absolute value accumulative maximum value of the sampled commercial voltage.

2. The power quality monitoring apparatus according to claim 1, further comprising a control unit to control so as to sample the absolute value accumulative maximum value of the commercial voltage in the extracting unit whenever the commercial voltage reaches a predetermined time by monitoring the applied commercial voltage.

3. The power quality monitoring apparatus according to claim 2, wherein the control unit controls so as to initialize the absolute value of the commercial voltage accumulated in the accumulating unit after controlling so as to sample the absolute value accumulative maximum value of the commercial voltage.

4. The power quality monitoring apparatus according to claim 2, wherein the predetermined time is a time when the commercial voltage is zero crossed.

5. The power quality monitoring apparatus according to claim 4, wherein the time when the commercial voltage is zero crossed reaches per a half period of the commercial voltage.

6. The power quality monitoring apparatus according to claim 2, wherein the control unit includes:
  a detector for detecting whether the commercial voltage reaches the predetermined time or not by monitoring the applied commercial voltage; and a timing controller for outputting an extraction control signal to the extracting unit so as to sample the absolute value accumulative maximum value of the commercial voltage in the extracting unit when the commercial voltage reaches the predetermined time.

7. The power quality monitoring apparatus according to claim 6, wherein the timing controller further outputs a reset control signal to the accumulating unit so as to initialize the absolute value of the commercial voltage accumulated in the accumulating unit after an extraction control signal is outputted to the extracting unit.

8. The power quality monitoring apparatus according to claim 1, wherein the extracting unit is a sample and hold circuit.

9. The power quality monitoring apparatus according to claim 1, wherein the commercial voltage is an alternative voltage.

10. The power quality monitoring apparatus according to claim 9, wherein the calculating unit includes a rectifier to rectifying the alternative voltage.

11. The power quality monitoring apparatus according to claim 1, further comprising a noise removing unit for removing a noise of the applied commercial voltage.

12. The power quality monitoring apparatus according to claim 1, further comprising a gain control unit for controlling a gain of an absolute value of the outputted commercial voltage.

13. The power quality monitoring apparatus according to claim 1, wherein the determining unit compares a predetermined reference voltage with an absolute value accumulative maximum value of the sampled commercial voltage and determines a quality of the commercial voltage by using the compared result.

14. The power quality monitoring apparatus according to claim 13, wherein the determining unit compares a first predetermined reference voltage and a predetermined second reference voltage with the absolute value accumulative maximum value of the sampled commercial voltage and determines whether a voltage swell or a voltage sag is generated at the commercial voltage by using the compared result.

15. The power quality monitoring apparatus according to claim 14, wherein the determining unit includes a first determining device to determine that the voltage swell is generate if the absolute value accumulative maximum value of the sampled commercial voltage is larger than the first reference voltage.

16. The power quality monitoring apparatus according to claim 14, wherein the determining unit includes a second determining device to determine that the voltage sag is generate if the absolute value accumulative maximum value of the sampled commercial voltage is smaller than the second reference voltage.

* * * * *